United States Patent [19]
Alemanni

[11] Patent Number: 4,549,651
[45] Date of Patent: Oct. 29, 1985

[54] CARRIER FOR PIN GRID ARRAY

[76] Inventor: James C. Alemanni, 3917 Sherbourne Dr., Oceanside, Calif. 92054

[21] Appl. No.: 684,847

[22] Filed: Dec. 21, 1984

[51] Int. Cl.[4] .................................................. B65D 73/02
[52] U.S. Cl. .................................... 206/329; 206/331; 206/560
[58] Field of Search ............... 206/328, 329, 331, 334, 206/560, 562, 563, 564

[56] References Cited

U.S. PATENT DOCUMENTS

| | | | |
|---|---|---|---|
| 3,605,062 | 9/1971 | Tinkelenberg | 206/329 |
| 3,653,498 | 4/1972 | Kisor | 206/331 |
| 3,701,079 | 10/1972 | Bowden et al. | 206/329 |
| 3,977,522 | 8/1976 | Van Der Aker et al. | 206/331 |
| 4,026,412 | 5/1977 | Henson | 206/331 |
| 4,073,381 | 2/1978 | Patterson | 206/331 |
| 4,379,505 | 4/1983 | Acemanni | 206/331 |

Primary Examiner—Joseph M. Moy
Attorney, Agent, or Firm—Duane C. Bowen

[57] ABSTRACT

A two-part carrier for a pin grid array having a body with a plurality of pins projecting from at least one face of the body includes an outer frame for extending around the perimeter of a separate removable carrier insert on which the pin grid array is releasably supported. The carrier insert has a recessed base for supporting the body of the pin grid array and an array of holes in a grid pattern through which the pins project when the body of the pin grid array is supported on the base. Resiliently flexible retention fingers at opposite ends of the carrier base engage the body of the supported pin grid array to retain it on the carrier insert base. The flexible retention fingers are bendable away from the carrier insert base for releasing engagement with the body of the supported pin grid array when either placing the pin grid array in the carrier insert or removing it from the carrier insert. Resilient clips on opposite inside faces of the frame cooperate with cam surfaces on opposite outer faces of the carrier insert for releasably attaching the carrier insert base to the inside of the outer frame in a snap lock to support the carrier insert inside the frame. The spring-biased clips are exposed in their snap-locked position for contact with an external force-applying means to release the clips from their snap-locked position when removing the carrier insert from the outer frame.

8 Claims, 10 Drawing Figures

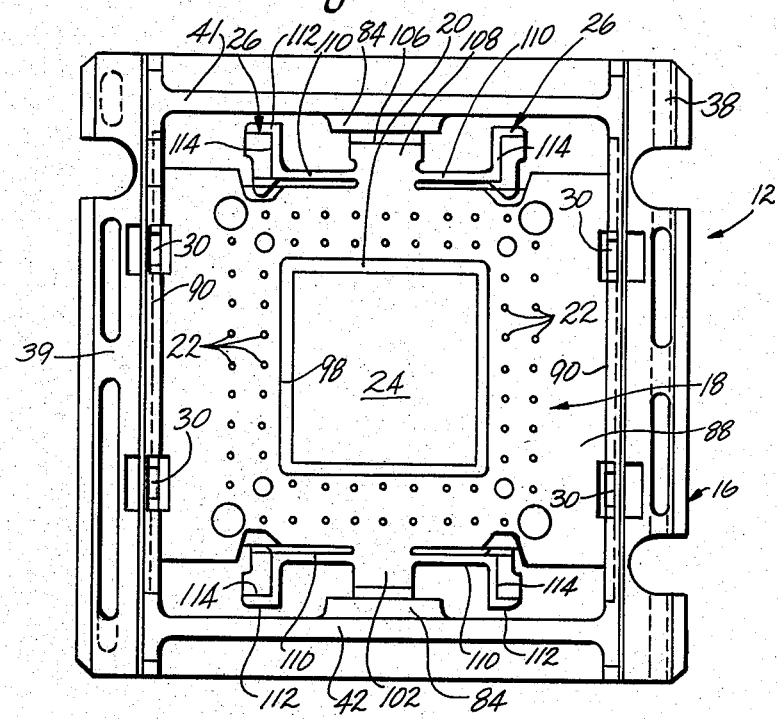
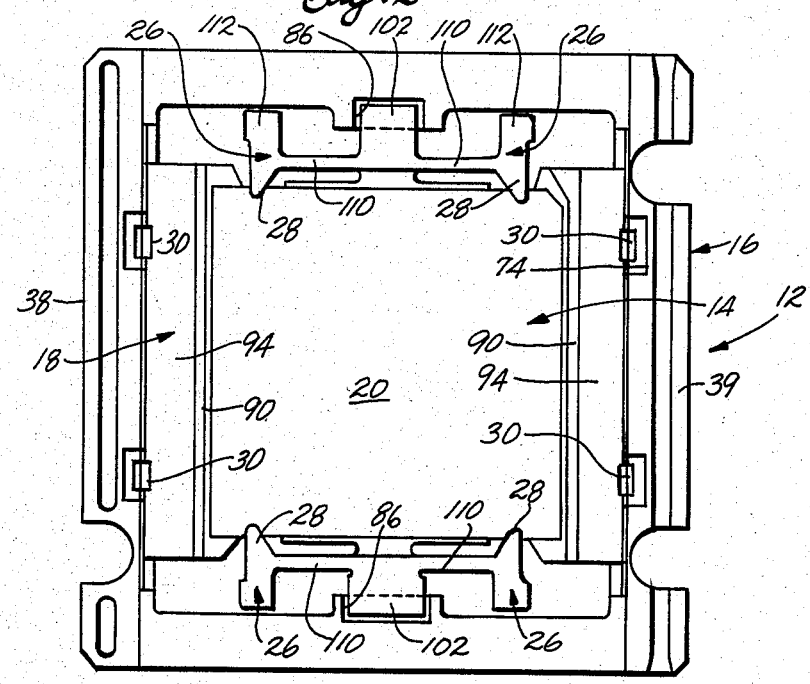

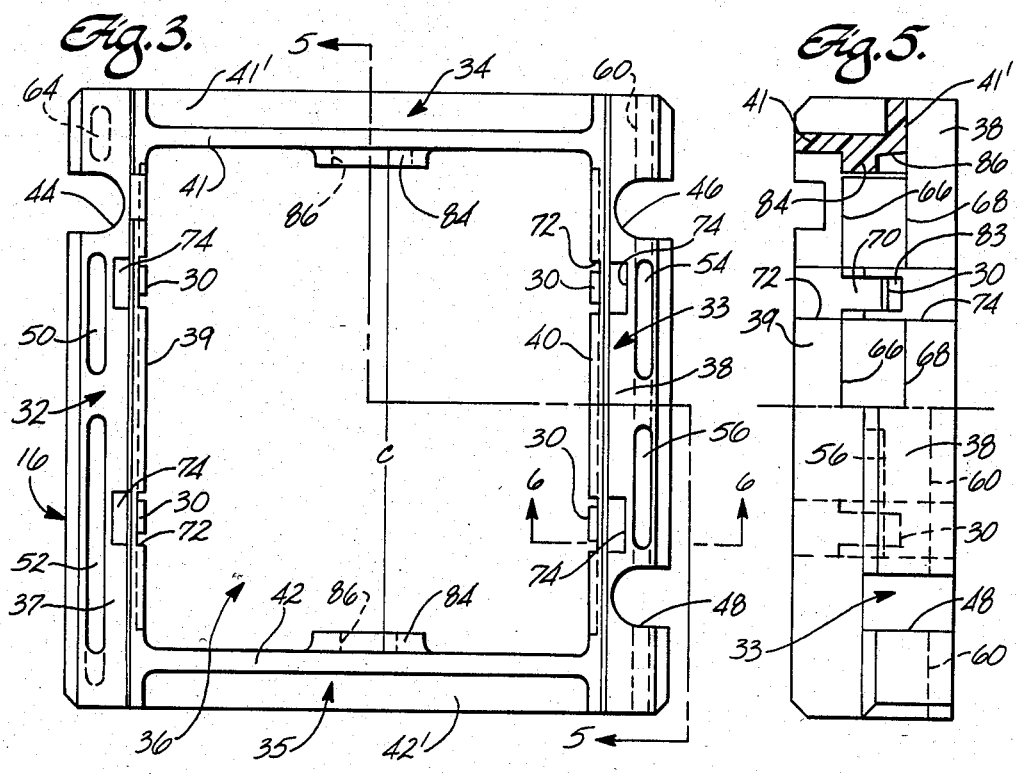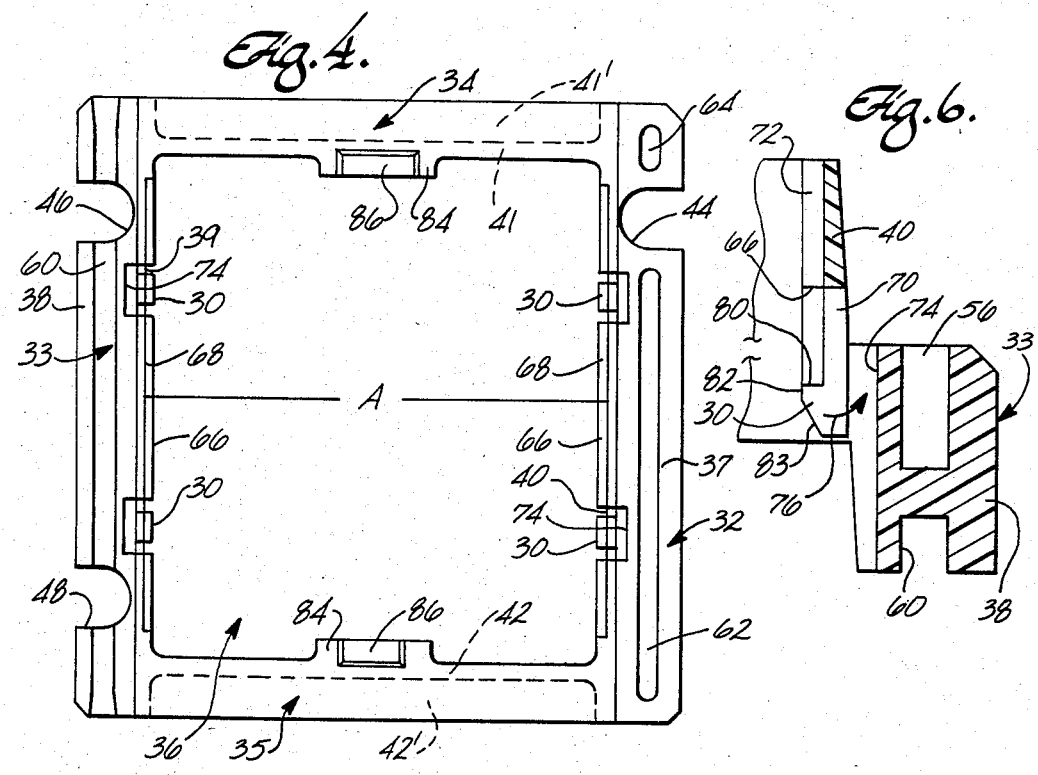

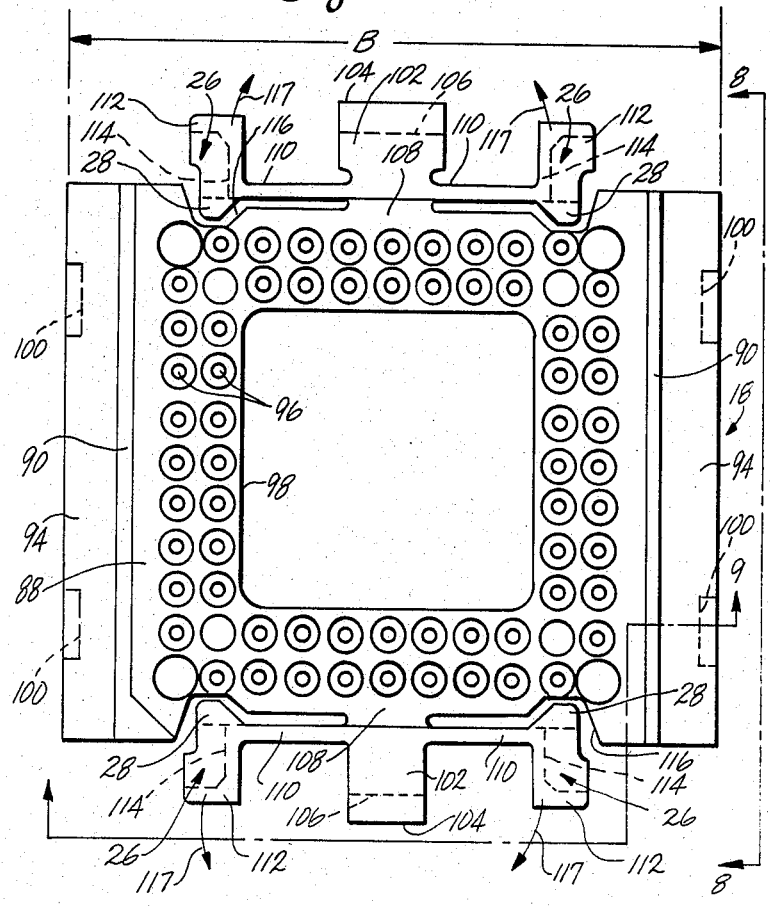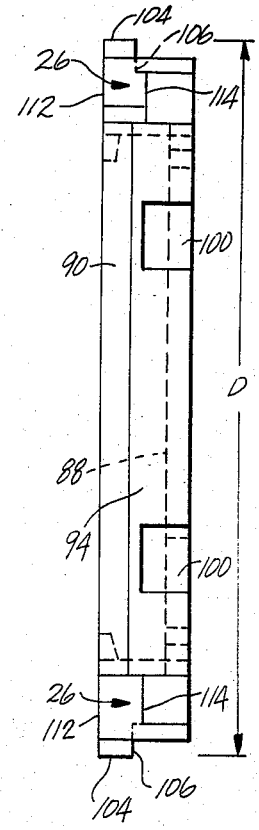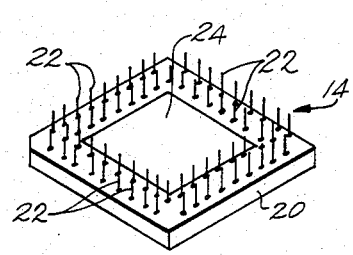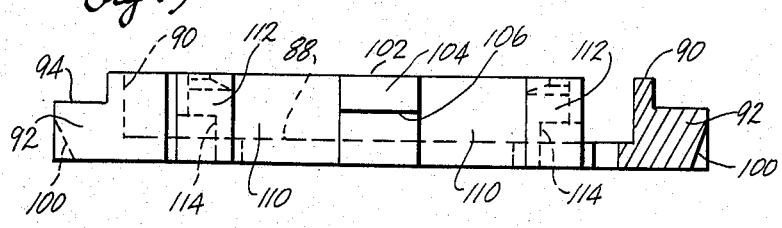

CARRIER FOR PIN GRID ARRAY

FIELD OF THE INVENTION

This invention relates to a carrier for pin grid array devices, and more particularly to a two-part carrier which provides extraordinary simplification, reduced cost, and other advantages in procedures for handling pin grid array devices supported on carriers.

BACKGROUND OF THE INVENTION

A pin grid array is an integrated circuit device generally having a flat and square shaped body with an array of electrical terminal pins projecting from a face of the body. A common pin grid array configuration comprises a square-shaped body with two or more parallel rows of pins extending around the perimeter of the body to form a grid pattern, with an integrated circuit chip in a central region of the body inside the pin grid pattern at the perimeter. Other pin grid array configurations also can be used.

A pin grid array is commonly manufactured in a wide variety of body sizes, which can vary from approximately 1.060 inch square to approximately 1.600 inch square, or larger, for example. The number of pins on a pin grid array also can vary, from nine pins per side to fifteen pins per side, or more, for example.

Pin grid arrays are commonly placed in individual carriers to protect them during subsequent handling steps. While placed in such carriers, the pin grid arrays can be marked and tested, for example. One carrier for a pin grid array comprises a base with an opening in its center and an array of holes around the central opening in a grid pattern to receive the pins of the pin grid array. The body of the pin grid array is mounted in a square-shaped recess on the opposite side of the carrier base so the pins extend through the holes of the base, while the integrated circuit (chip) is retained in the central opening of the carrier. Flexible retaining clips adjacent the rectangular recess clip onto opposite sides of the body for holding it in place on the carrier base. The chips can be spread apart by mechanical means when removing the pin grid array from the carrier.

This type of carrier requires a different carrier design for each different pin grid array device. Inasmuch as pin grid arrays are available in different body sizes, the retaining mechanism in each carrier must be arranged to connect to a pin grid array body of a specific size, while the hole pattern in the carrier must match the array of pins on each different pin grid array. Tooling or machinery used to open the carrier also must vary for each different sized pin grid array. The opening mechanism must engage the retaining clips at their correct locations on each different type of carrier device to remove its particular sized pin grid array.

The present invention provides a two-part pin grid array carrier which avoids disadvantages of the one-piece pin grid array carriers. The two-part carrier of this invention greatly reduces production costs for constructing pin grid array carriers capable of carrying various sizes of pin grid arrays. In addition, the two-part carrier permits pin grid arrays to be removed from the carrier independently of the size of the pin grid array body so that a common opening mechanism can be used for all pin grid array sizes. In addition, the pin grid array can be removed from one part of the carrier while being retained in its own part of the carrier. This protects the pin grid array during subsequent testing and other handling steps while not interfering with such testing as is commonly the case with the present one-piece carriers. The two-part carrier of this invention has further advantages when compared with the one-piece pin grid array carriers, and these further advantages are described below.

SUMMARY OF THE INVENTION

Briefly, one embodiment of this invention comprises a two-part carrier for a pin grid array having a body with a plurality of pins projecting from at least one face of the body. The two-piece carrier comprises an outer carrier frame having rigid side walls extending around the perimeter of an open space within the frame. A carrier insert comprises a base for supporting the body of the pin grid array. The base has an array of holes through which the pins project when the body of the pin grid array is supported on the carrier insert. Flexible retention means on the carrier base engage the body of the pin grid array for retaining it in the carrier. The flexible retention means are bendable away from the base of the carrier insert for releasing engagement with the body of the pin grid array. Releasable fastening means cooperate between the base of the carrier insert and the side walls of the outer frame for connecting the base to the frame in a snap lock to support the carrier insert inside the open space of the frame so the pin grid array is retained on the carrier insert with the frame extending around the perimeter of the carrier insert. The releasable fastening means are exposed in the snap locked position for contact with an external force applying means to release the fastening means from the snap locked position to remove the carrier insert from the frame.

The carrier insert can be made in different sizes to match the shape and size of the different pin grid arrays. The outer frame is common to all pin grid array sizes. The common frame greatly reduces the cost and materials for producing carriers capable of fitting pin grid arrays of various sizes. This is especially true for users who have a variety of sizes of pin grid array devices. When a user has a large volume of pin grid array devices in any one size, economies are achieved by simultaneous (family) molding of both the carrier insert and the frame in a multi-cavity mold. In addition, the fastening means for releasably connecting the carrier insert to the outer frame are commonly located for all pin grid array carrier inserts. Thus, the same tooling and mechanism can be used to remove the carrier and pin grid array from the frame for all pin grid array sizes. The retention means for retaining the pin grid array on the carrier insert also is commonly located for all opening mechanisms so that the same mechanism can remove pin grid arrays of various sizes from their carrier inserts. Once the pin grid array is removed from the outer frame and retained in its carrier insert, the carrier insert protects the pin grid array during subsequent handling steps. The carrier insert also is shaped so as not to interfere with subsequent handling steps. It permits simplified testing of pin grid arrays, such as in a common burn-in socket, for example.

These and other aspects of the invention will be more fully understood by referring to the following detailed description and the accompanying drawings.

DRAWINGS

FIG. 1 is a top plan view showing an assembled two-part pin grid array carrier according to principles of this invention FIG. 2 is a bottom plan view showing the assembled pin grid array carrier of FIG. 1.

FIG. 3 is a top plan view showing the outer carrier frame of the pin grid array carrier.

FIG. 4 is a bottom plan view showing the outer frame of the pin grid array carrier.

FIG. 5 is a side elevation view, partly in cross section, taken on line 5—5 of FIG. 3.

FIG. 6 is an enlarged cross sectional view taken on line 6—6 of FIG. 3.

FIG. 7 is a top plan view showing the carrier insert of the pin grid array carrier.

FIG. 8 is a side elevation view taken on line 8—8 of FIG. 7.

FIG. 9 is a side elevation view, partly in cross section, taken on line 9—9 of FIG. 7.

FIG. 10 is a perspective view illustrating a typical pin grid array used with the carrier of this invention.

DETAILED DESCRIPTION

FIGS. 1 and 2 are top and bottom elevation views showing an assembled two-part pin grid array carrier 12 with a pin grid array 14 retained in the carrier 12. The two-part carrier is made of hard plastic and has a generally rectangular outer carrier frame 16 and a separate carrier insert 18 releasably connected to the inside of the outer frame so that the outer frame extends around the perimeter of the carrier insert.

Referring briefly to FIG. 10, the carrier of this invention provides means for retaining a pin grid array of the type shown in FIG. 10, which includes a generally flat and square-shaped body 20 made from a material which is an electrical insulator. An array of electrical terminal pins 22 project from one face of the body 20. An integrated circuit chip 24 is affixed to the central flat face side of the body. The integrated circuit may be affixed to either side of the body. The terminal pins provide easily accessible electrical leads for the integrated circuit when used in testing the integrated circuit or in later plugging the pin grid array into a printed circuit board, for example. In the illustrated embodiment, the pin grid array has an 11×11 matrix of terminal pins in which the pins are arranged in a grid pattern of two parallel rows extending adjacent each of the four outer edges of the body. The center of the body has a square-shaped open region for connection to the integrated circuit chip 24. Other ebodiments of the pin grid array are possible, such as variations in the size or shape of the pin grid array body, or variations in the number and spacing of the electrical terminal pins. (As mentioned above, the views of FIGS. 1 and 2 are referred to as top and bottom views of the carrier 12. For consistency in this description, the pin grid array 14 is described as having a top face shown in FIG. 1 and a bottom face shown in FIGS. 2 (although it is recognized that those in the art commonly refer to the face from which the terminal pins 22 project as the bottom face of the device.)

Referring again to FIGS. 1 and 2, the pin grid array 14 is shown placed in the assembled carrier of this invention. The carrier insert 18 has flexible retention fingers 26 with flanged projections 28 which overlap the bottom face of the pin grid array body 20 (as shown best in FIG. 2) to hold the pin grid array in the carrier insert 18. Flexible clips 30 on the inside walls of the outer frame 16 are releasably attached to opposite outer edges of the carrier insert in a snap lock to releasably hold the carrier insert inside the carrier frame.

Detailed construction of the outer frame 16 is understood best by referring to FIGS. 3 through 6. FIG. 3 is a top view of the carrier frame and FIG. 4 is a bottom view in which the frame shown in FIG. 3 has been rotated 180 degrees. The outer frame is square, having long, narrow left and right side walls 32 and 33 extending parallel to one another along left and right sides of the frame, respectively, as the frame is viewed in FIG. 3. The frame also includes long, narrow first and second end walls 34 and 35 extending at right angles to the side walls and extending parallel to one another along opposite ends of the frame. The side and end walls of the frame extend around the perimeter of a rectangular open space 36 confined within the frame. In the preferred embodiment the frame is square in shape.

The left and right side walls 32 and 33 preferably have relatively wide flanged outer portions 37 and 38, respectively, on which the carrier frame rests. Relatively thin left and right upright wall sections 39 and 40 are integral with and extend above the flanged outer portions 37 and 38 of the side walls. This configuration of the side walls is best illustrated in the cross sectional view of FIG. 6, which shows the thin upright wall sections 39 and 40 parallel to and inboard from the wider flanged outer portions 37 and 38 of the side walls. The first and second end walls 34 and 35 also have first and second relatively thin upright wall sections 41 and 42 at the same elevation and integral with the ends of the thin left and right upright wall sections 39 and 40. This forms a thin rectangular peripheral wall elevated above the flanged outer portions of the side walls which serve as long rails elevating the rectangular peripheral wall above the surface on which the rails rest to support the carrier frame.

A U-shaped slot 44 is located in the outer edge of the flanged outer wall portion 37 of the left side wall 32. A pair of spaced apart U-shaped slots 46 and 48 are located in the outer edge of the flanged outer portion 38 of the right side wall 33. Long, narrow depressions 50 and 52 are located in the top edge of the left flanged outer wall section 37, and long, narrow depressions 54 and 56 are located in the top edge of the right flanged wall section 38. These depressions are for weight reduction, to reduce mass for best consumption during high temperature testing. A long, narrow notch 60 extends the length of the bottom face of the flanged outer wall section 38 of the right side wall 33. The notch provides polarity orientation and is an industry standard. Long and short notches 62 and 64, respectively, extend along the bottom face of the flanged outer wall section 37 of the left side wall 32. The first end wall 34 has a narrow outer ridge 41' extending at a right angle to the thin upright section 41 of the first end wall. The second end wall 42 has a narrow outer ridge 42' extending at a right angle to the thin upright section 42 of the second end wall. These provide structural integrity.

The number, size and positions of the slots, depressions and notches can vary and are merely shown as examples of means that cooperate with various types of mechanized equipment for handling the carrier in a well known manner.

As described previously, the flexible clips 30 for fastening to the carrier insert 18 are located on the inside faces of the left and right frame side walls 32 and 33. In the illustrated embodiment, a pair of such clips are spaced apart along the length of each side wall, at locations about one-third and two-thirds of the distance along each side wall. A downwardly facing elongated upper shoulder 66 (shown best in FIG. 5) extends along the inside face of each thin upright wall section 39 and 40 of the left and right side walls 32 and 33. The clips 30 extend below the upper shoulders 66, as shown best in FIG. 6. Each upper shoulder 66 extends parallel to the bottom edge of its side wall and at a right angle to the vertical inside face of the thin upright wall section on which it is located. Each upper shoulder 66 is located about one-third the distance down from the top of the frame side wall. A similar narrow downwardly facing elongated lower shoulder 68 (shown best in FIG. 5) extends along approximately the lower one-third of each thin upright wall section 39 and 40 parallel to the upper shoulder 68. The lower shoulders 68 are recessed into the wall sections farther than the upper shoulders 66, so that both shoulders face downwardly.

Each clip 30 is on the bottom of an elongated resilient spring-like lever arm 70 extending vertically adjacent the inside face of the frame side wall. A separate narrow notch 72 is formed above each lever arm in the thin upright wall section of the side wall which supports the lever arm. This adds a degree of flexibility to each lever arm, as well as allowing the part to be molded. Each notch 72 extends the full depth of the frame side wall. That is, each notch also extends into the inside face of the flanged outer portions 37 and 38 of the frame side walls, which are spaced outwardly from the inside face of their thin upright wall sections 39 and 40. This portion of each notch is shown best at 74 in FIG. 6. This leaves an open spaced behind each lever arm and clip into which the lever arm can bend or rotate as illustrated by the arrow 76 in FIG. 6. About the bottom two-thirds of each lever arm is narrowed in width, as shown best in FIG. 5. Each clip 30 has a projection at the bottom of the flexible lever arm 70, and the clip projects inwardly toward the open space 36 within the frame. Each clip 30 includes an upwardly facing shoulder 80 extending at a right angle to the length of the lever arm 70, a narrow inside face 82 below the upper shoulder 80, and downwardly and inwardly inclined ramp surface 83 below the upper shoulder 80. These details of the clips are best shown in FIG. 6.

The first and second end walls of the carrier frame include central projections 84 extending inwardly toward the central opening 36 within the frame. Each central projection extends about the lower one-half of the height of the end wall, and each projection has a recess 86 which faces downwardly and extends about one-half the height of the central projection.

The carrier insert 18 is understood best by referring to FIGS. 7 through 9. The carrier insert has a thin and flat base 88 with side walls extending along outer edges of the base. The side walls are of composite configuration having thin upright wall sections 90 spaced inwardly from and extending parallel to the outer edges of the base. The thin upright wall sections 90 form the maximum height of the carrier insert. Flanged outer edge sections 92 of the side walls extend outward from the thin upright wall sections 90, and form upwardly facing right angle shoulders 94 extending along opposite sides of the base outwardly from and adjacent to the thin upright wall sections 90.

An array of holes 96 extends entirely through the depth of the base 88. In the illustrated embodiment the base has a large central square opening 98, and the holes extend in a grid pattern of two rows uniformly spaced apart along each of the four sides of the base adjacent the central opening 98. Each hole 96 is preferably countersunk or relieved in a similar manner with an enlarged upper section of each hole facing the side of the base illustrated in FIG. 7. The illustrated embodiment is a carrier insert for a pin grid array having a 11×11 array of terminal pins as illustrated in FIG. 10.

A spaced-apart pair of downwardly and inwardly angled notches 100 (shown best in FIG. 9) are located in the outer face of each outer side wall section 92 of the side walls of the carrier insert. These notches have a width sufficient to cooperate with the projecting spring-biased clips 30 of the lever arms 70 to provide a cam surface engaged by the clips for snap locking the carrier insert inside the outer frame as described in more detail below.

A pair of center alignment tabs 102 are located at opposite ends of the base 88, at an elevation above the top surface of the base. Each alignment tab has a flanged outer tip 104 with a downwardly facing right angle shoulder 106. The center alignment tabs are offset outwardly from the outer edges of the base 88 by a narrow neck 108 which is integral with the base and which supports the alignment tab outwardly from the base.

Each alignment tab 102 supports the retention fingers 26 which comprise narrow, upright legs 110 extending in opposite directions away from the tab parallel to the adjacent end of the base 88. The legs 110 have flanged tips 112 which project outwardly from the legs at a right angle away from the outer edge of the base 88. The narrow, thin legs 110 are at a height approximately the same as the thin, upright wall sections 90 along opposite sides of the base, so that the legs of the retention fingers form end walls at opposite ends of the base 88. The flanged tips 112 have recessed regions 114 on their underside that form openings facing downwardly and laterally outwardly away from the central axis of the base. As shown best in FIG. 7, the inside ends of the retention fingers have the inward projections 28 that overlap the bottom base of a pin grid array when the array is retained in the carrier insert. Opposite ends of the base 88 also include a pair of recessed sections 116 located below the projections 28. The retention fingers are bendable outwardly from the outer edges of the base 88 under application of an external bending force generally horizontally outwardly against the outer face of the recess 114 in the flanged tip of each retaining finger. The arrows 117 in FIG. 7 illustrate the direction in which the retention fingers are able to bend. When the external bending force is released the resiliency of the legs 110 automatically returns the retaining fingers to the normal position shown in FIGS. 1, 2 and 9.

In using the two-part carrier, the pin grid array is first placed in the carrier insert. Although a variety of techniques can be used, in one technique the pin grid array is preferably held by a vacuum head (not shown) attached to the body of the pin grid array. The four retention fingers 26 at opposite ends of the carrier insert are simultaneously pushed horizontally outwardly from the base 88 of the carrier insert by an actuating mechanism that includes four pins (not shown) for applying an outward force to the recessed regions 116 at the tips 112 of the retention fingers. This bends the fingers simultaneously away from the recessed region within the carrier insert, and the fingers are retained in this position until the pin grid array is placed on the base 88. With the resilient fingers held in their outward positions, and the carrier insert held in the upwardly facing position shown in FIG. 7, the vacuum head is lowered to place the body 20 of the pin grid array in the recessed central portion of the carrier insert with sufficient downward force to extend the pins 22 of the pin grid array downwardly through the holes 96 in the base 88. Once the pin grid array is in place in the carrier, the vacuum head is retracted and the outward force from the pins at the tips of the fingers is released. This allows the fingers to immediately return to their normal positions in which the flanged inside portions 28 of the retention fingers 26 extend over the bottom face of the pin grid array body to hold the pin grid array in the carrier. With the pin grid array in place in the carrier, the side walls 90 of the carrier insert extend along opposite sides of the pin grid array body, and the legs 110 of the retention fingers extend adjacent the outer ends of the pin grid array body. The vertical distance between the flanged tips 28 of the retention fingers and the base 88 of the carrier insert matches the thickness of the pin grid array body to hold the pin grid array within the carrier insert without significant motion of the pin grid array in the carrier. With the pin grid array in place in the carrier insert, the integrated circuit 24 of the pin grid array is exposed within the central opening 98 of the carrier, as shown in FIG. 1.

Once the pin grid array is placed in the carrier insert, the carrier insert is next snap locked into a fixed position within the outer carrier frame 16. (Alternatively, the carrier insert can be snap locked into the outer frame before the pin grid array device is placed in the carrier insert.) In the description to follow, it is assumed tht the outer frame 16 is held in the upwardly facing position shown in FIGS. 1 and 3, and the carrier insert 18 is held in a position reversed 180 degrees from that shown in FIG. 7. The carrier insert is positioned inside the frame so that the side walls 94 of the carrier insert are positioned adjacent the clips 30 on the inside walls 39, 40 of the outer frame. This positions the tapered cam surfaces 100 on the side walls 94 of the carrier insert against the ramp surfaces 83 of the clips 30 so that an external upward force applied to the bottom of the carrier insert causes the surfaces 83 and the flanged tips 82 of the clips 30 to ride down and outwardly on the cam surfaces 100, as the carrier insert is pushed upwardly into the frame. This bends the lever arms 70 of the clips outwardly toward the adjacent open spaces 74 of the sides of the frame. Continued upward force on the carrier insert finally causes the edges of the carrier to pass around the flanged tips of the clips, while the natural spring bias of the clips causes the lever arms 70 to spring back and the flanged tips of the clips to hook onto the underside of the shoulders 94 on the sides of the carrier insert, in a snap lock which holds the carrier insert in a fixed position inside the carrier frame. The shoulders 80 of flanged portions of the clips are engaged with the underside of the shoulders 94 on carrier insert to lock the carrier insert in the frame. In the locked position, the surface of the base 88 is engaged with the shoulders 66 on the inside face of the carrier frame. The spacing between the tops 80 of the flanged tips of the retaining clips and the underside of the shoulder 66 matches the thickness of the carrier insert side wall portions 92. This causes the clips to retain the base in a fixed position against the shoulders 66 to prevent movement of the insert once locked in the frame. With the carrier insert and pin grid array located inside the outer frame, the alignment tabs 102 project into the recessed portions 86 of the projections 84 at opposite ends of the carrier frame. This can provide a tongue and groove means for contact between these portions of the carrier insert and the frame to stabilize the carrier insert against vertical motion within the frame.

The two-part carrier makes it possible to mass produce carrier frames of a common size and configuration for a wide variety of pin grid array devices having different body sizes and pin grid arrangements. The carrier insert only needs to be constructed to match the particular pin grid array device, and different carrier inserts then can be inserted into the common frame. Regardless of the size and pin arrangement of the particular pin grid array, the various carrier inserts can all fit into the outer frame by positioning the cam surfaces 100 on each carrier insert to cooperate with the clips 30 on the frame in a snap lock. The clips are also positioned on the frame so that a common mechanism can engage the clips and apply an external force outwardly and downwardly to the locked clips to release them from engagement with the carrier insert when removing the carrier insert from the outer frame. Similarly, the retaining fingers 26 are positioned at opposite ends of the carrier insert so that they fit within the common frame without interference. The retaining fingers also are positioned on each carrier insert so that a common mechanism can be used to engage the recessed sections 116 of the fingers and bend the fingers outwardly when removing the pin grid array from the carrier insert.

In the illustrated embodiment, only a few dimensions need to be fixed for the carrier frame to match cooperating dimensions of each carrier insert. For instance, in the illustrated embodiment the distance A between the inside faces of the frame side walls 90 beneath the shoulders 66, as illustrated in FIG. 4, is 1.54 inches; and the corresponding width B of each different carrier insert, independently of the size and pin arrangement of the particular pin grid array, is 1.539 inches. The distance C between the central alignment recessed regions 88 at opposite ends of the frame is 1.66 inches and the distance D between opposite ends of the tabs of the carrier insert also is approximately 1.66 inches. (These dimensions are examples only, since the carrier can be produced in different sizes to accommodate pin grid arrays of differing dimensions.) All carrier inserts, independently of the size of the pin grid array they carry, have their tapered cam surfaces 100 all configured and arranged so that the clips 30 on the carrier frame can engage the tapered surfaces and snap lock onto the carrier insert when the carrier insert is pushed into the frame.

The invention also permits the two parts of the carrier to be molded using different materials to provide ESD protection. The carrier insert may be molded in a variety of colors also for part identification.

The location of the retention clips is uniform for all variations of the carrier insert. When using the one-piece carrier of the prior art with its retention clip arrangement, tooling and machinery used to open the carrier had to vary for each different sized pin grid array device. The two-part carrier of this invention places the opening mechanism in the same physical location for all pin grid array devices thereby providing tooling commonality.

Furthermore, the two-part carrier allows the user to remove the frame from the exterior of the carrier insert and still have the pin grid array device in a mechanical, electrically protected carrier. This then allows the user to place the assembly in a burn-in socket of any size for testing the pin grid array. There are no obstructions over the top of the carrier insert while the pins of the pin grid array are exposed, which allows the socket of a burn-in tester to be placed over it so the pin grid array can be tested while retained in the carrier insert. The carrier insert also allows the user to ship the pin grid array protected in a less costly carrier, if desired. The carrier in this instance can be shipped in protective outer tubing, for example.

A further benefit is the use of less materials in constructing the assembled frame and carrier insert when compared with the prior art single piece carrier. The two-part frame and carrier insert also provides substantially more open space within the carrier which greatly improves heat dissipation from testing in a burn-in socket, for example.

I claim:

1. A two-part carrier for a pin grid array having a body with a plurality of pins projecting from at least one face of the body, the two-piece carrier comprising:
   an outer frame having rigid side walls extending around the perimeter of an open space within the frame;
   a carrier insert comprising a base for supporting the body of the pin grid array, the base having an array of holes through which the pins project when the body of the pin grid array is supported on the base, and flexible retention means on opposite ends of the carrier base for engaging the body of the supported pin grid array for retaining it on the carrier insert base, said flexible retention means being bendable away from the carrier insert base for releasing engagement with the body of the supported pin grid array; and
   releasable fastening means cooperating between the carrier insert base and the side walls of the frame for attaching the carrier insert base to the frame in a snap lock to support the carrier insert inside the open space within the frame with the pin grid array supported on said carrier insert, and with the frame extending around the perimeter of the carrier insert, the releasable fastening means being exposed in said snap-locked position for contact with an external force applying means to release the fastening means from the snap locked position to remove the carrier insert from the frame.

2. Apparatus according to claim 1 in which the releasable fastening means comprises spring-biased clips carried on the inside face of the frame, and cooperating peripheral edge surfaces on the base of the carrier insert for engaging the spring-biased clips in said snap lock.

3. Apparatus according to claim 2 in which the frame has a peripheral shoulder against which the outer peripheral edges of the carrier insert base are retained when the clips are snap-locked onto the carrier insert base.

4. Apparatus according to claim 1 in which the flexible retention means comprise resiliently flexible retention fingers on opposite ends of the carrier insert having means for contacting the pin grid array body for retaining it in its supported position on the carrier insert base, the retention fingers being bendable against their normal bias away from the position of contact with the pin grid array body for releasing the retention means from contact with the pin grid array body for use in removing the body from the base of the carrier.

5. Apparatus according to claim 4 in which the resiliently flexible retention fingers also include means for gripping end portions of the fingers by an external force-applying means for bending the retaining fingers away from contact with the pin grid array body.

6. Apparatus according to claim 1 including indexing means cooperating between the carrier insert base and the side walls of the frame for releasably engaging the carrier insert base and the frame when the carrier insert base is in the snap-locked position to prevent relative movement between the carrier insert base and the frame.

7. Apparatus according to claim 2 including indexing means cooperating between the carrier insert base and the side walls of the frame for releasably engaging the carrier insert base and the frame when the carrier insert base is in the snap-locked position to prevent relative movement between the carrier insert base and the frame.

8. Apparatus according to claim 7 in which the indexing means comprise a projecting tab at each end of the carrier insert base which is not engaged by the clips and a cooperating recess on the inside face of the frame for engaging each indexing tab.

* * * * *